United States Patent
Le Neel et al.

(10) Patent No.: US 11,391,624 B2
(45) Date of Patent: Jul. 19, 2022

(54) LIGHT SENSOR COMPRISING A BAND-STOP FANO RESONANCE FILTER OVER A PHOTOCONVERSION AREA

(71) Applicants: STMicroelectronics SA, Montrouge (FR); STMicroelectronics (Crolles 2) SAS, Crolles (FR)

(72) Inventors: Olivier Le Neel, Saint Martin d Uriage (FR); Stephane Monfray, Eybens (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 30 days.

(21) Appl. No.: 17/116,851

(22) Filed: Dec. 9, 2020

(65) Prior Publication Data
US 2021/0172791 A1    Jun. 10, 2021

(51) Int. Cl.
G02B 5/20  (2006.01)
G01J 1/04  (2006.01)
G01J 1/44  (2006.01)
H01L 27/144  (2006.01)

(52) U.S. Cl.
CPC .............. G01J 1/0437 (2013.01); G01J 1/44 (2013.01); G02B 5/20 (2013.01); H01L 27/144 (2013.01)

(58) Field of Classification Search
CPC .. G01J 1/0437; G01J 1/44; G02B 5/20; G02B 5/204; G02B 5/207; H01L 27/144; H01L 27/1446; H01L 27/146; H01L 27/14601

USPC ................................. 250/226, 208.1, 214 R
See application file for complete search history.

(56) References Cited

U.S. PATENT DOCUMENTS 10,747,985 B2 * 8/2020 Xiao ................. H04N 5/2256
2016/0064436 A1   3/2016 Uchida et al.

FOREIGN PATENT DOCUMENTS

WO   2019142687 A1   7/2019

OTHER PUBLICATIONS

INPI Search Report and Written Opinion for FR 1914079 dated Nov. 2, 2020 (8 pages).
Shuai Yichen, et al: "Double-Layer Fano Resonance Photonic Crystal Filters," Optics Express 24582, Oct. 21, 2013, vol. 21, No. 21 (8 pages).
Shen, Yichen, et al: "Structural Colors from Fano Resonances," Physics.Optics, Oct. 30, 2014, arXiv:1410.8589v1 (6 pages).

* cited by examiner

*Primary Examiner* — Que Tan Le
(74) *Attorney, Agent, or Firm* — Crowe & Dunlevy

(57) ABSTRACT

A light sensor includes a first pixel and a second pixel. Each pixel has a photoconversion area. A band-stop Fano resonance filter is arranged over the first pixel. The second pixel includes no Fano resonance filter. Signals output from the first and second pixels are processed to determine information representative of the quantity of light received by the light sensor during an illumination phase in a rejection band of the band-stop Fano resonance filter.

24 Claims, 8 Drawing Sheets

LIGHT SENSOR COMPRISING A BAND-STOP FANO RESONANCE FILTER OVER A PHOTOCONVERSION AREA

PRIORITY CLAIM

This application claims the priority benefit of French Application for Patent No. 1914079, filed on Dec. 10, 2019, the content of which is hereby incorporated by reference in its entirety to the maximum extent allowable by law.

TECHNICAL FIELD

The present disclosure generally concerns electronic circuits and, in particular, light sensors and method of manufacturing the filters of such sensors, particularly when such light sensors are provided to implement a spectral analysis of the light that they receive.

BACKGROUND

Light sensors allowing a spectral analysis of received light are known. Such sensors, for example, enable determination, for a given quantity of received light to be analyzed, of how this quantity of light is distributed between a plurality of wavelength ranges. Such sensors generally comprise a plurality of pixels, each provided with a photoreceiver, or photoconversion area, where the photoreceiver of the pixel is associated with a filter blocking light at given wavelengths, different for at least some of the pixels.

There is a need for a light sensor which overcomes all or part of the disadvantages of the above-described known light sensors.

There is a need in the art to overcome all or part of the disadvantages of the above-described known light sensors.

SUMMARY

An embodiment provides a light sensor comprising pixels, each comprising a photoconversion area, wherein a first one of said pixels comprises a first Fano resonance filter and a second one of said pixels comprises no Fano resonance filter.

According to an embodiment, said first filter comprises a periodic structure defined in a first layer of a first dielectric material.

According to an embodiment, said first filter comprises a first layer of a second dielectric material and a second layer of the second dielectric material, the first layer of the first dielectric material resting on the first layer of the second dielectric material and being covered with the second layer of the second dielectric material.

According to an embodiment, the first dielectric material is selected from the group comprising amorphous carbon, amorphous silicon, silicon nitride, non-doped polysilicon, and silicon carbide, the second dielectric material is preferably silicon oxide.

According to an embodiment: the first layer of the first dielectric material is in contact with the first layer of the second dielectric material; or the first filter further comprises a second layer of the first dielectric material resting on top of and in contact with the first layer of the second dielectric material, and a third layer of a dielectric material, preferably of the second dielectric material, resting on top of and in contact with the second layer of the first dielectric material, the first layer of the first dielectric material resting on top of and in contact with said third layer.

According to an embodiment, the periodic structure has a pitch smaller than a wavelength filtered by said first filter.

According to an embodiment, the first filter is of band-stop type.

According to an embodiment, a third one of said pixels comprises a second Fano resonance filter having a central frequency different from that of the first filter.

According to an embodiment, the second filter comprises all the layers of the first filter and a periodic structure defined in the first layer of the first dielectric material.

According to an embodiment, the sensor further comprises a circuit configured to receive, from each of said pixels, an output signal representative of the quantity of light received by the photoconversion area of the pixel during a pixel illumination phase, and to determine, from the output signal of the first pixel and from the output signal of the second pixel, information representative of the quantity of light received by the sensor during the illumination phase in a rejection band of the first filter.

According to an embodiment, the first pixel further comprises a device configured so that light reaches the first filter under a normal incidence.

According to an embodiment, the first layer of the second dielectric material rests on a first antireflection coating and/or a second antireflection coating rests on the second layer of the second dielectric material.

An implementation mode provides a manufacturing method comprising the steps of: a) forming a first layer of a first dielectric material resting on a first layer of a second dielectric material; b) forming at least one Fano resonance filter by etching, across at least part of the thickness of the first layer of the first dielectric material, portions of the first layer of the first dielectric material to define therein a periodic structure of said at least one filter; c) forming a second layer of the second dielectric material to cover the first layer of the first dielectric material; and d) planarizing an exposed surface of the second layer of the second dielectric material by a chemical-mechanical polishing.

According to an embodiment, the method further comprises: before step a), a step of forming a first antireflection coating having the first layer of the second dielectric material resting thereon; and/or at step d), a step of forming a second antireflection coating resting on the second layer of the second dielectric material.

According to an embodiment: step a) comprises the forming of a second layer of the first dielectric material resting on the first layer of the second dielectric material, and then the forming of a dielectric etch stop layer resting on top of and in contact with the second layer of the first dielectric material; at step a), the first layer of the first dielectric material is formed on top of and in contact with the etch stop layer; and at step b), the etching of the first layer of the first dielectric material is stopped on the etch stop layer.

According to an embodiment: at step a), the first layer of the first dielectric material rests on a semiconductor substrate having photoconversion areas of pixels of a light sensor defined therein, at least one of said pixels being intended to comprise said at least one filter defined in the first layer of the first dielectric material, and at least one of said pixels being intended to comprise no Fano resonance filter defined in the first layer of the first dielectric material; or after step d), a stack comprising the layers formed at the previous steps is transferred above a semiconductor substrate having photosensitive areas of pixels of a light sensor defined therein, so that at least one of said pixels comprises said at least one filter defined in the first layer of the first dielectric material, and at least one of said pixels comprises no Fano resonance filter defined in the first layer.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DETAILED DESCRIPTION

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the embodiments and of the implementation modes which will be described have been shown and are detailed. In particular, the various electronic systems and applications where a light sensor can be provided have not been detailed, the described embodiments being compatible with such usual electronic systems and applications. Further, the readout circuits of a sensor pixel, configured to generate an output signal of the pixel having a value representative of the quantity of light received by a photo-conversion area of the pixel, have not been detailed, the described embodiments being compatible with usual readout circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, call operating wavelength of a light sensor the wavelengths in a wavelength range where the sensor is, for example, capable of providing a spectral analysis of the received light. In the following description, the case of a sensor having operating wavelengths in the range from 300 nm to 900 nm is considered as an example.

In the following description, a material is called absorbing at a wavelength for example if, when a light ray at this wavelength hits under a normal incidence a layer having a one-micrometer thickness of this material, at least 90% of the optical power of the ray is absorbed by the layer and less than 10% of the optical power of the ray is reflected by the layer and/or transmitted through the layer.

In the following description, when reference is made to a first layer resting on a second layer, this means, unless otherwise specified, that the first layer rests on the second layer directly, the first layer then being in contact with the second layer, or indirectly on the second layer, one or a plurality of layer then being interposed between the first and second layers.

In the following description, a Fano resonance filter a filter using the optical Fano resonance phenomenon. In such a filter, the incident light on a periodic dielectric structure of the filter excites a confined surface mode supported by the surface of the periodic structure. The confined or local mode interferes with the light reflected by the surface of the periodic structure. When the local mode and the reflected light have the same phase, constructive interferences between the local mode and the reflected light result in a reflected light peak, or, in other words, in a light reflection peak. Thus, there exists a wavelength for which the light incident on the filter is reflected at more than 80%, or even at more than 90%, the wavelength determining the central frequency of the filter. A Fano resonance filter thus behaves as a band-stop filter, conversely, for example, to a plasmonic filter.

Examples of Fano resonance filters are described in article "Double-layer Fano resonance photonic crystal filters" of Yichen Shuai et al., published in Optics Express Vol. 21, Issue 21, pp. 24582-24589 (2013), and in article "Structural Colors from Fano Resonances" of Yichen Shen et al., published in ACS Photonics 2015, 2, 1, 27-32 (the disclosures of both hereby incorporated by reference).

The light sensor disclosed herein takes advantage of the selectivity of Fano resonance filters. More particularly, the light sensor comprises pixels, each provided with a photo-conversion area, where at least one pixel is provided with a band-stop Fano resonance filter having a given central frequency, and at least another pixel comprises no Fano resonance filter. Thus, when the sensor receives light to be analyzed, by comparing the quantity of light received by the photoconversion area of a pixel provided with a Fano resonance filter with that received by the photoconversion area of a pixel comprising no such filter, information representative of the proportion of light to be analyzed in a wavelength range substantially equal, or even equal, to the rejection band of the filter, may be determined.

Figure 1:
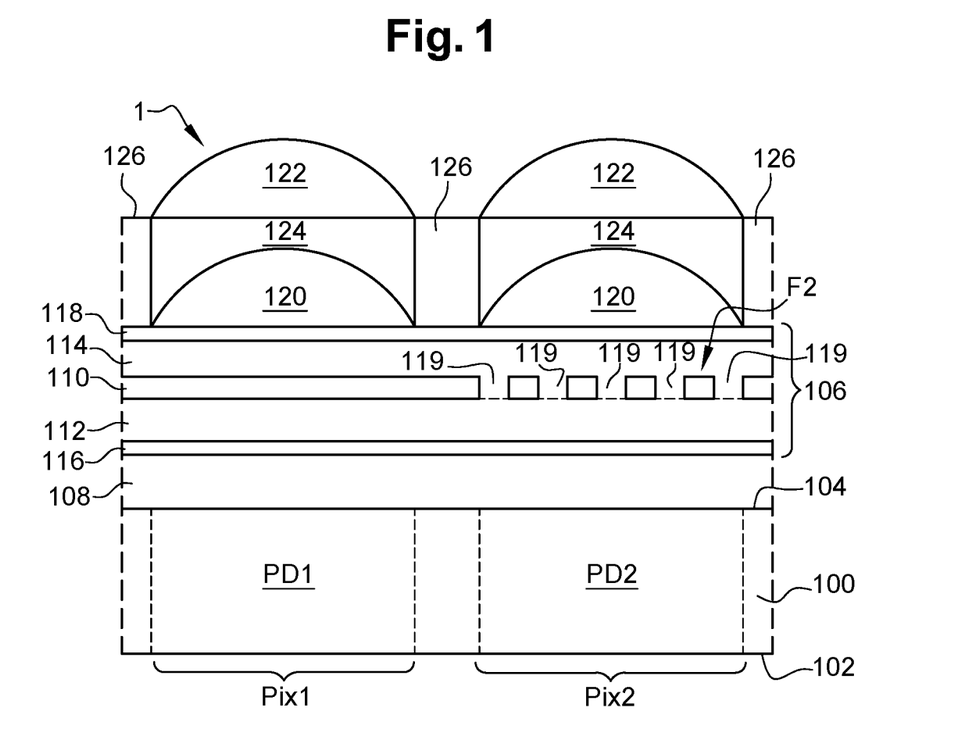
FIG. 1 is a simplified cross-section view of a portion of a light sensor according to an embodiment.

FIG. 1 is a simplified cross-section view illustrating an embodiment of such a light sensor 1, a portion only of the sensor 1 being shown in FIG. 1.

Sensor 1 comprises pixels, for example, several tens of pixels, or even several hundreds of pixels, although the portion of sensor 1 illustrated in FIG. 1 only comprises two pixels Pix1 and Pix2.

Sensor 1 comprises a semiconductor substrate 100, for example, made of silicon. Components and electronic circuits (not shown in FIG. 1), for example, readout circuits of the pixels of sensor 1, are formed inside and/or on top of substrate 100, on the side of a front surface 102 of substrate 100 (lower surface of substrate 100 in FIG. 1). Substrate 100 further comprises a rear surface 104 (upper surface of substrate 100 in FIG. 1), opposite and substantially parallel, or even parallel, to front surface 102, the rear surface being, in this example, intended to receive light.

Each pixel of sensor 1 comprises a photoconversion area. Each photoconversion area extends in substrate 100, between the front surface 102 of substrate 100 and the rear surface 104 of substrate 100, for example, from front surface 102 to rear surface 104. The photoconversion areas of the pixels of sensor 1 are electrically insulated from one another by electrically-insulating walls, not shown in FIG. 1, the insulating walls being preferably opaque to the operating wavelengths of the sensor. The insulating walls laterally delimit the photoconversion areas of the pixels. In FIG. 1, only photoconversion areas PD1 and PD2 of the respective pixels Pix1 and Pix2 are shown and are laterally delimited by dotted lines.

A light filtering structure 106 rests, for example, indirectly, on substrate 100, on the surface 104 of substrate 100 intended to receive light. In the example of FIG. 1, structure 106 rests on top of and in contact with a layer 108 or a stack of insulating layers 108, layer(s) 108 resting on top of and in contact with surface 104 of substrate 100. In another example, not shown, layer(s) 108 are omitted, and structure 106 rests on top of and in contact with the surface 104 of substrate 100. Preferably, structure 106 extends above all the pixels of sensor 1, each pixel then comprising a corresponding portion of structure 106.

Structure 106 comprises a layer 110 made of a dielectric material or, in other words, an electrically-insulating material. The material of layer 110 is, for example, selected from amorphous carbon, amorphous silicon, silicon nitride, non-doped polysilicon, that is, non-intentionally doped, and silicon carbide. Structure 106 further comprises a layer 112 and a layer 114, delimited with respect to each other by dotted lines in FIG. 1. Layers 112 and 114 are made of a same dielectric material, different from that of layer 110. The material of layers 112 and 114 is, for example, silicon oxide or silicon nitride, preferably silicon oxide. Layer 110 rests on layer 112 and layer 114 covers layer 110. In an embodiment, layer 114 also is in contact with layer 110 at locations where portions of layer 110 are not present.

In the embodiment of FIG. 1, layer 110 directly rests on layer 112. As an example, the thickness of layer 110 is then in the range from 10 to 500 nm, for example, equal to 200 nm.

In the embodiment of FIG. 1, structure 106 comprises an optional antireflection layer or coating 116 having layer 112 resting thereon, layer 112 then preferably directly resting on antireflection coating 116 or, in other words, in contact with coating 116.

In the embodiment of FIG. 1, structure 106 comprises an optional antireflection layer or coating 118 resting on layer 114, antireflection coating 118, for example, directly resting on layer 114.

Structure 106 comprises one or a plurality of Fano resonance filters, particularly a filter F2 forming part of pixel Pix2. Filter F2 is arranged above and opposite area PD2 of pixel Pix2.

Further, structure 106 comprises no Fano resonance filter above and opposite area PD1 of pixel Pix1. In other words, pixel Pix1 comprises no Fano resonance filter, conversely, for example, to pixel Pix2.

Thus, sensor 1 comprises at least one pixel, for example, pixel Pix2, comprising a Fano resonance filter, and at least one pixel, for example, pixel Pix1, comprising no Fano resonance filter. In the following description, a pixel is said to comprise no Fano resonance filter when this pixel comprises no Fano resonance filter defined in structure 106 and, similarly, a pixel is said to be provided with a Fano resonance filter when the pixel comprises a Fano resonance filter defined in structure 106.

Each filter of structure 106 comprises all the layers of structure 106 and a periodic structure defined in layer 106 at the location of the filter, that is, opposite the photosensitive area of the pixel comprising the filter. In particular, the filter F2 of pixel Pix2 comprises a periodic structure defined in layer 110, above and opposite its photoconversion area PD2.

In the embodiment of FIG. 1, the periodic structure of filter F2 is defined by openings 119 through the entire thickness of layer 104, where the number of these openings may be different from that shown in FIG. 1.

Further, in the embodiment of FIG. 1, the pixel Pix1 comprising no Fano resonance filter comprises all the layers of structure 106, and in particular layer 110. However, no periodic Fano resonance filter structure is defined in layer 110 above and opposite the photoconversion area PD1 of pixel Pix1 as shown in FIG. 1 or a periodic structure is defined in layer 110 above and opposite the photoconversion area PD1 of pixel Pix1, but with dimensions which do not result in a Fano resonance.

Preferably, as illustrated in FIG. 1, sensor 1 further comprises, at least for each pixel provided with a Fano resonance filter, an optical device configured so that the light reaching the Fano resonance filter of the pixel is under a normal incidence with respect to the filter, that is, under a normal incidence with respect to the upper surface of layer 114 or, in other words, under a normal incidence with respect to structure 106. Preferably, the pixel(s) of sensor 1 comprising no Fano resonance filter also each comprise such an optical device so that the light reaches structure 106 under a normal incidence, that is, under a normal incidence with respect to the upper surface of layer 114. The optical devices rest on structure 106, preferably directly on structure 106.

In the embodiment of FIG. 1, for each concerned pixel, particularly pixels Pix1 and Pix2, the optical device comprises: a doublet of converging lenses 120 and 122 arranged one under the other; a layer 124 of a dielectric material covering the lower lens 120 of the lens doublet and having the upper lens 122 of the lens doublet resting thereon; and a lateral wall 126 made of an absorbing material at the operating wavelengths of the sensor, for example, a wall 126 made of black resin, laterally surrounding lens doublet 120, 122, at least along the entire height of the stack of lens 120 and of material 124. As an example, walls 126 are aligned with the electric insulation walls (not shown) laterally delimiting the pixel photoconversion areas. The focal distances of lenses 120 and 122 and their positioning with respect to each other are selected so that light crossing lenses 120 and 122 reaches structure 106 under a normal incidence.

In an alternative embodiment, not shown, lenses 120 and 122 are replaced with a doublet of converging lenses external to sensor 1, for example, two external lenses arranged in an opening of a package having sensor 1 enclosed or encapsulated therein. In this variant, layer 124 and/or wall 126 may be omitted.

Although this is not shown in FIG. 1, sensor 1 comprises an interconnection structure on the side of front surface 102 of substrate 100, to electrically connect the electronic components which are formed therein.

In an alternative embodiment not illustrated, sensor 1 is intended to receive light on the side of front surface 102 of substrate 100. In this case, structure 106 then rests on surface 102 of substrate 100. For example, structure 106 rests on the interconnection structure, itself resting on surface 102 of substrate 100 and, when they are provided, the optional optical devices enabling, for example, by means of a doublet of converging lenses, to obtain a light under a normal incidence with respect to structure 106 then rest on structure 106, on the side of structure 106 opposite to substrate 100.

Further, although this is not shown, sensor 1 comprises a processing circuit configured to receive, at least from each of pixels Pix1 and Pix2, preferably from each pixel of sensor 1, an output signal delivered by a pixel readout circuit (not shown). The output signal is representative of the quantity of light received by the photoconversion area of the pixel during a phase of illumination or of integration of sensor 1.

In operation, sensor 1 receives light to be analyzed.

The photoconversion areas of the pixels of sensor 1 provided with a Fano resonance filter each receive light to be analyzed carried by the operating wavelengths of the sensor, except for the wavelengths in the rejection band of the Fano resonance filter of this pixel. Further, the photoconversion areas of the pixels of sensor 1 comprising no Fano resonance filter each receive light to be analyzed carried by all the operating wavelengths of sensor 1. For each of these pixels, provided or not with a Fano resonance filter, the pixel readout circuit delivers, for example, to the processing circuit of sensor 1, an output signal representative of the quantity of light to be analyzed received by the pixel. Thus, the output signal of a pixel provided with a Fano resonance filter is representative of the proportion of light to be analyzed carried by the operating wavelengths of sensor 1, except for the wavelengths in the rejection band of the Fano resonance filter of this pixel. Similarly, the output signal of a pixel comprising no Fano resonance filter is representative of the total proportion of light to be analyzed carried by all the operating wavelengths of sensor 1.

According to a light analysis implementation mode, sensor 1, for example, its processing circuit, is configured to deliver a signal or information representative of the proportion of the light to be analyzed carried by wavelengths in the rejection band of a Fano resonance filter of a first pixel, based on the output signal of the first pixel and on the output signal of a second filter comprising no Fano resonance filter. For this purpose, sensor 1, preferably its processing circuit, is, for example, configured to subtract the value of the output signal of the first pixel from that of the output signal of the second pixel. The result of such a subtraction is then representative of the proportion or quantity of light to be analyzed carried by the wavelengths in the rejection band of the Fano resonance filter of the first pixel.

Preferably, sensor 1, for example its processing circuit, is configured to apply a correction factor to the value of the output signal of the first pixel and/or a correction factor to the value of the output signal of the second pixel before subtracting them from each other. The correction factor(s) are determined, for example, during a step of calibration of sensor 1, to take into account, outside of the rejection band of the filter of the first pixel, differences in the transmission of light through the portion of structure 106 belonging to the first pixel and through the portion of structure 106 belonging to the second pixel, and/or to take into account a possible surface area difference between the photoconversion areas of the first and second pixels. The correction factor(s) may, for example, be recorded in a memory, preferably non-volatile, of sensor 1. Further, the determination of such correction factors is within the abilities of those skilled in the art.

Preferably, sensor 1, for example, its processing circuit, is configured to normalize the values of the output signals of the first and second pixels by the value of the output signal of the second pixel comprising no Fano resonance filter. Such a normalization step may be implemented after having applied a correction factor to the value of the output signal of the first pixel and/or a correction factor to the value of the output signal of the second pixel, or may be followed by the application of a correction factor to the normalized output value of the first pixel and/or of a correction factor to the normalized output value of the second pixel. The correction factors are for example determined as described previously.

As an illustration, calling $\lambda$min the minimum operating wavelength of sensor 1, $\lambda$max the maximum operating wavelength of sensor 1, $\lambda$minF2 the lower wavelength of the rejection band of filter F2, for example, of the rejection band at −3 dB of filter F2, and $\lambda$maxF2 the upper wavelength of the rejection band of filter F2, for example, of the rejection band at −3 dB of filter F2, the photoconversion area of pixel Pix2 receives the light to be analyzed having wavelengths in the range from $\lambda$min to $\lambda$minF2, and from $\lambda$maxF2 to $\lambda$max, while the photoconversion area of pixel Pix1 receives the light to be analyzed having wavelengths in the range from $\lambda$min to $\lambda$max. Thus, the output signal of pixel Pix2 is representative of the quantity of light to be analyzed received by the photoconversion area of pixel Pix2 for wavelengths in the range from $\lambda$min to $\lambda$minF2, and from $\lambda$maxF2 to $\lambda$max, the output signal of pixel Pix1 being representative of the light to be analyzed received by the photoconversion area of pixel Pix1 for wavelengths in the range from $\lambda$min to $\lambda$max. Sensor 1, for example, its processing circuit, then delivers information representative of the proportion of light to be analyzed received by the sensor, which is carried by the wavelengths in the range from $\lambda$minF2 to $\lambda$maxF2, for example, by subtracting the value of the output signal of pixel Pix2 from that of pixel Pix1.

As an example of application, when the sensor comprises a plurality of pixels, each provided with a Fano resonance filter defined in structure 106, and the Fano resonance filters have different rejection bands, sensor 1 is, for example, used to obtain information representative of the spectral light distribution between different wavelengths, each corresponding to a rejection band of a Fano resonance filter. Sensor 1 then forms an ambient light sensor (ALS).

According to another light analysis implementation mode capable of being used independently or in combination with the above-described implementation mode, a step of calibration of sensor 1 is provided.

During the calibration step, sensor 1 is successively illuminated with different types of light, that is, with lights having different spectrums, for example, blue light, natural light, light emitted by a screen, incandescent light, fluorescent light, halogen light, light originating from a defined light source having crossed a known sample, light originating from a defined light source and having been reflected by a known sample, etc. For each type of light, sensor 1, for example, its processing circuit, is configured to store in sensor 1, for example, in a memory, preferably non-volatile, of sensor 1, all the values of the output signals of the pixels, preferably after a step of normalization of these values with the values of an output signal of a pixel comprising no filter. Each set of stored values forms a mapping of the output values of the pixels representative of the type of received light.

During a subsequent step when sensor 1 receives light to be analyzed, all the output values of the pixels obtained for the light to be analyzed, preferably normalized as previously described, form a mapping of the output values of the pixels representative of the type of received light. The mapping is then compared by sensor 1, for example, by its processing circuit, with the mappings stored in sensor 1 during the calibration step to determine the type of received light to be analyzed, or even, in the case where the light is transmitted through a sample to be analyzed or reflected by a sample to be analyzed, the composition of the sample. As an example, sensor 1, for example, its processing circuit, is configured to calculate information representative of the difference between the mapping of the output values of the pixels obtained for the light to be analyzed and each of the mappings of the output values of the pixels stored during the calibration phase, the type of received light being then identified as that corresponding to the mapping obtained during the calibration phase for which the difference is the smallest, or at least considered as very close to the type of light corresponding to the mapping obtained during the calibration phase for which such a difference is the smallest.

An advantage of sensor 1 is that it may comprise several tens, or even several hundreds of Fano resonance filters having different central frequencies, which enables to analyze the light over several tens, or even several hundreds, of wavelength ranges.

Another advantage of sensor 1 is that each light analysis wavelength range corresponding to the rejection band of a Fano resonance filter is narrow and has, for example, a width or an extension smaller than or equal to 10 nm.

It could have been devised to form a light sensor by using multilayer interferometric filters rather than Fano resonance filters. However, when sensor 1 is intended to analyze light over several tens, or even several hundreds of wavelength ranges, the manufacturing of such a sensor is more complex, longer, and more expensive than that of sensor 1.

It could also have been devised to form a light sensor by using plasmonic filters rather than Fano resonance filters. However, plasmonic filters have a low spectral selectivity and such a sensor would not have enabled to analyze light over narrow wavelength ranges, conversely to what is allowed by sensor 1.

Further, the use of a light filter with plasmonic filters to analyze light over at least two wavelength ranges relatively distant from each other, for example, two wavelength ranges separated from each other by a wavelength range having a 400-nm width, raises an issue. Indeed, due to the distance between the two analysis ranges, the metal of a plasmonic filter enabling to analyze the light in one of the two ranges differs from that of a plasmonic filter enabling to analyze the light in the other one of the two ranges. This makes the plasmonic filter sensor and its manufacturing more complex and more expensive than for sensor 1.

Figure 2:
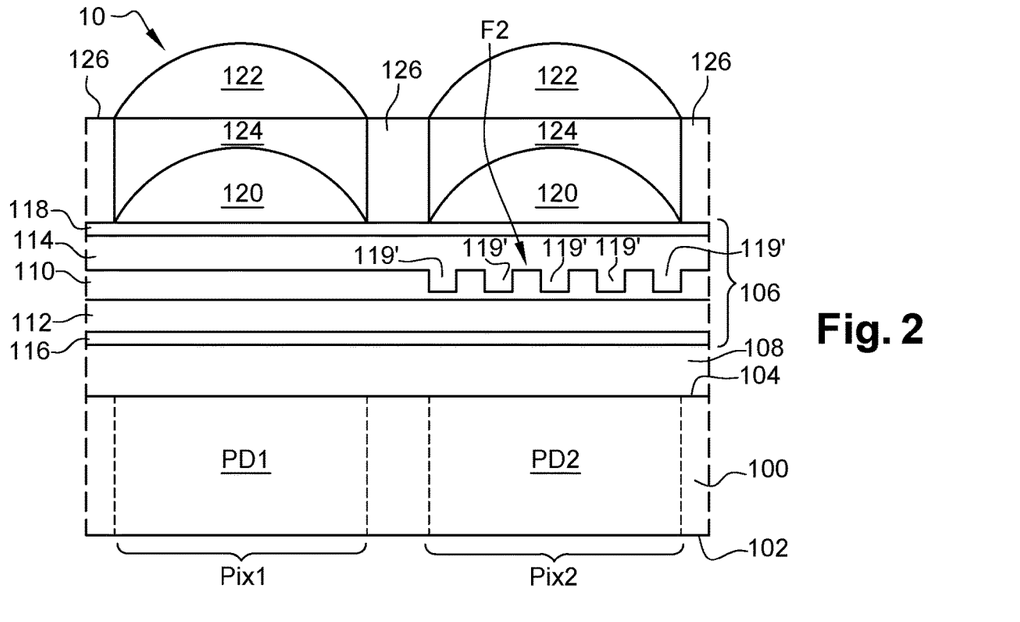
FIG. 2 is a simplified cross-section view of a portion of a light sensor according to an alternative embodiment.

FIG. 2 is a simplified cross-section view illustrating an alternative embodiment of sensor 1. More particularly, FIG. 2 shows a portion only of a sensor 10 according to this alternative embodiment, the shown portion of sensor 10 corresponding to the portion of sensor 1 shown in FIG. 1. Only the structural and possibly functional differences between sensors 1 and 10 are detailed herein.

The sensor 10 of FIG. 2 differs from the sensor 1 of FIG. 1 only in the way in which the Fano resonance filters are formed. More particularly, as compared with the sensor 1 of FIG. 1 where the periodic structure of a Fano resonance filter is formed by openings 119 crossing layer 110 across its entire thickness, in the alternative embodiment of FIG. 2, the periodic structure of a Fano resonance filter is formed by openings or cavities 119' which do not cross layer 110 across its entire thickness. As for example shown in FIG. 2 for filter F2, openings 119' penetrate into layer 110 from the surface of layer 110 intended to receive light or, in other words, from the surface of layer 110 opposite to the surface of layer 110 arranged on the side of substrate 100. As an example, openings 119' penetrate into layer 110 across substantially half its thickness, for example, across half of its thickness. As an example, in this alternative embodiment, layer 110 has the same thickness as in the embodiment of FIG. 1.

The provision of openings 119' which do not cross layer 110 across its entire thickness, for example, which only penetrate into the layer across half of its thickness, enables to decrease possible parasitic resonances with respect to the case of FIG. 1.

Figure 3:
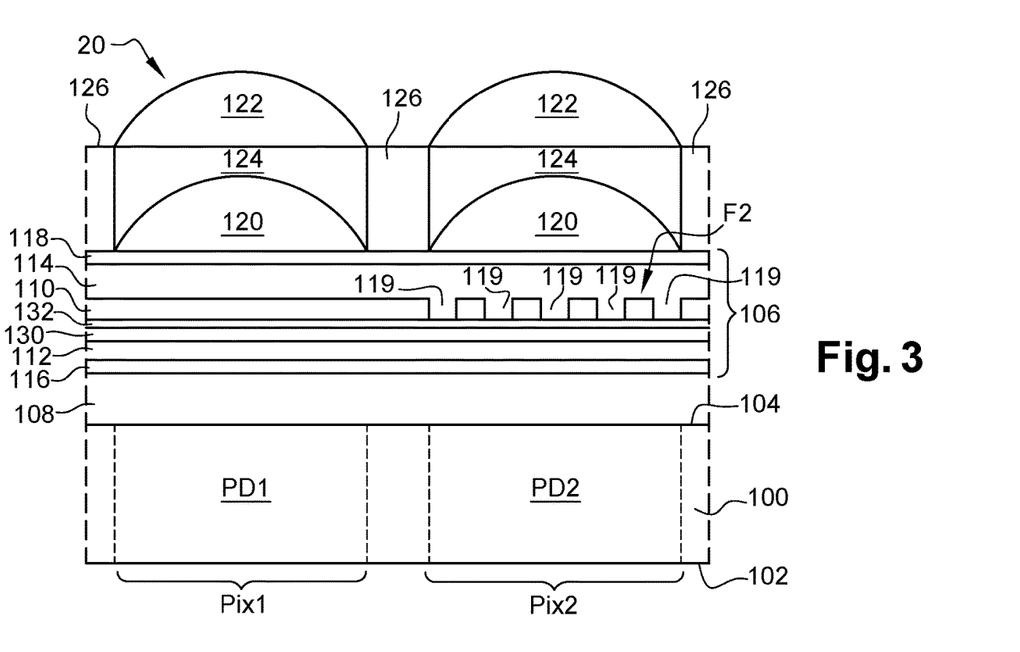
FIG. 3 is a simplified cross-section view of a portion of a light sensor according to another alternative embodiment.

FIG. 3 is a simplified cross-section view illustrating another alternative embodiment of sensor 1. More particularly, FIG. 3 shows a portion only of a sensor 20 according to this other alternative embodiment, the shown portion of sensor 20 corresponding to the portion of sensor 1 shown in FIG. 1. Only the structural and possible functional differences between sensors 1 and 20 are detailed herein.

The sensor 20 of FIG. 3 differs from the sensor 1 of FIG. 1 only in the way in which the Fano resonance filters are formed. More particularly, as compared with the sensor 1 of FIG. 1 where layer 110 directly rests on layer 112, in the alternative embodiment of FIG. 3, structure 106 further comprises a layer 130 made of the same material as layer 110, and a layer 132 made of a dielectric material such that layer 110 is selectively etchable over layer 132. As an example, layer 132 is made of the same material as layers 112 and 114. As an example, the thickness of layer 132 is in the range from 2.5 nm to 15 nm, for example, equal to 5 nm. As an example, in the alternative embodiment of FIG. 3, the thickness of layer 110 is substantially equal, or even equal, to half the thickness of the layer 110 of the embodiment of FIG. 1. As an example, the thickness of layer 130 is substantially equal, or even equal, to that of layer 110.

Layer 110 directly rests on layer 132, itself directly resting on layer 130, layer 130 then directly resting on layer 112. Openings 119 through the entire thickness of layer 110 then emerge onto layer 132 or, as a variation, onto layer 130 when the portions of layer 132 at the bottom of openings 119 are removed.

The provision of layer 130 made of the same material as layer 110, for example, with a same thickness as layer 110, enables to decrease possible parasitic resonances with respect to the case of FIG. 1.

The Fano resonance filters implemented according to the alternative embodiments of FIGS. 2 and 3 have less secondary peaks or rejection bands outside of the main rejection band of the filter, the latter being substantially centered on the central frequency of the filter. In other words, Fano resonance filters according to the alternative embodiments of FIGS. 2 and 3 are more selective than Fano resonance filters according to the embodiment of FIG. 1. Further, Fano resonance filters of the alternative embodiment of FIG. 3 are simpler to form than those of the variant of FIG. 2, due to the fact that layer 132 is used as an etch stop layer for openings 119.

Figure 4:
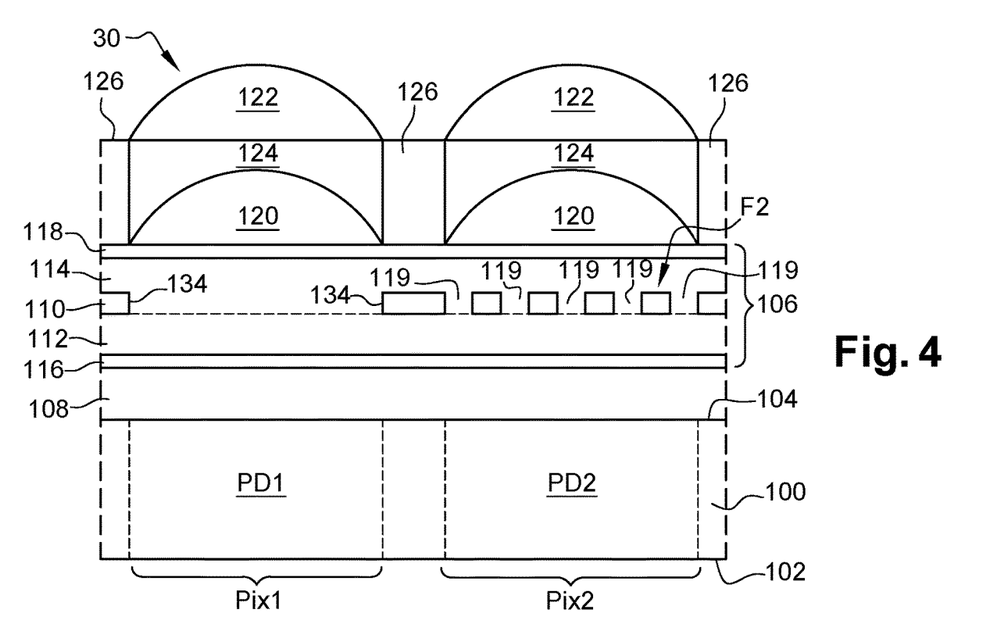
FIG. 4 is a simplified cross-section view of a portion of a light sensor according to still another alternative embodiment.

FIG. 4 is a simplified cross-section view illustrating still another alternative embodiment of sensor 1. More particularly, FIG. 4 shows a portion only of a sensor 30 according to this other alternative embodiment, the shown portion of sensor 30 corresponding to the portion of sensor 1 shown in FIG. 1. Only the structural and possible functional differences between sensors 1 and 30 are detailed herein.

The sensor 30 of FIG. 4 differs from the sensor 1 of FIG. 1 only in the way in which structure 106 is implemented above the photoconversion area of a pixel comprising no Fano resonance filter, as for example for pixel Pix1. More particularly, as compared with the sensor 1 of FIG. 1 where the layer 110 of structure 106 is present above the photoconversion area of each pixel, even when the pixel, like pixel Pix1, comprises no Fano resonance filter, in the variant of FIG. 4, layer 110 is interrupted above the photoconversion area of each pixel comprising no Fano resonance filter. In other words, a portion of layer 110 has been removed above the photoconversion area of each pixel comprising no Fano resonance filter. Still in other words, an opening 134 is provided through the entire thickness of layer 110, above and opposite the photoconversion area of each pixel comprising no Fano resonance filter, the dimensions, in top view, of opening 134 being at least equal to, or even greater than, those of the photoconversion area of the pixel.

The alternative embodiment of FIG. 4 is compatible with those of FIGS. 2 and 3. In particular, in the case where structure 106 comprises layers 130 and 132 as described in relation with FIG. 3, layer 130 and/or layer 132 may be interrupted in the same way as layer 110, above the photoconversion area of each pixel comprising no Fano resonance filter.

Figure 5:
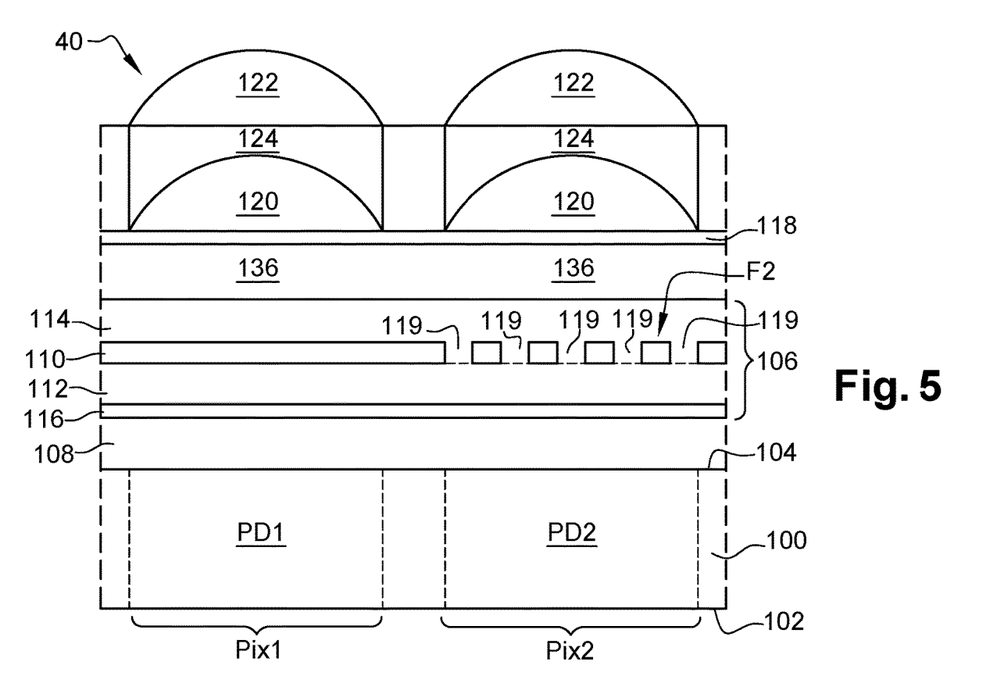
FIG. 5 is a simplified cross-section view of a portion of a light sensor according to still another alternative embodiment.

FIG. 5 is a simplified cross-section view illustrating still another alternative embodiment of sensor 1. More particularly, FIG. 5 shows a portion only of a sensor 40 according to this other alternative embodiment, the shown portion of sensor 40 corresponding to the portion of sensor 1 shown in FIG. 1. Only the structural and possible functional differences between sensors 1 and 40 are detailed herein.

In this variant, at least certain pixels of sensor 40 comprise, in addition to structure 106 provided or not with a Fano resonance filter according to the considered pixel, an additional filter 136 (or filtering structure 136). The additional filter is, for example, a Fano resonance filter similar to the filter F2 already described, a multilayer interferometric filter, a plasmonic filter, or a filter comprising colored resin. Additional filter 136 rests, preferably directly, on structure 106 and more particularly on the layer 114 of structure 106.

In operation, sensor 40, for example, its processing circuit, is then preferably configured to deliver information representative of the proportion of the light to be analyzed carried by wavelengths in a rejection band of a Fano resonance filter based on the output signal of the pixel comprising the Fano resonance filter and on the output signal of a pixel comprising no Fano resonance filter in structure 106, but provided with a filter 136 identical to that of the pixel comprising the Fano resonance filter.

As an example, in FIG. 5, pixel Pix1 and pixel Pix2 each comprise a filter 136 made of a same colored resin. Thus, the photoconversion area PD1 of pixel Pix1 only receives the light to be analyzed in a sub-range of operating wavelengths of sensor 40, which sub-range is defined by the filtering properties of the colored resin, and the photoconversion area PD2 of pixel Pix2 only receives the light to be analyzed in this wavelength sub-range except for the wavelengths of the rejection band of Fano resonance filter F2. Sensor 40, for example, its processing circuit, is, for example, configured to deliver information representative of the proportion of light to be analyzed carried by the wavelengths in the rejection band of filter F2 based on the output signals of pixels Pix1 and Pix2 as described in relation with FIG. 1. The provision of a filter 136 enables to improve the signal-to-noise ratio of the output signals of the pixels topped with filter 136, due to the fact that the wavelength range of the light received by the photoconversion areas of the pixels is narrower than in the absence of filter 136.

As shown in FIG. 5, in the case where structure 106 is coated with filters 136, the optional antireflection coating 118, when it is provided, then rests on filters 136, and thus does not form part of structure 106.

The alternative embodiment of FIG. 5 is compatible with the alternative embodiments of structure 106 such as described in relation with FIGS. 2, 3, and 4.

Figure 6:
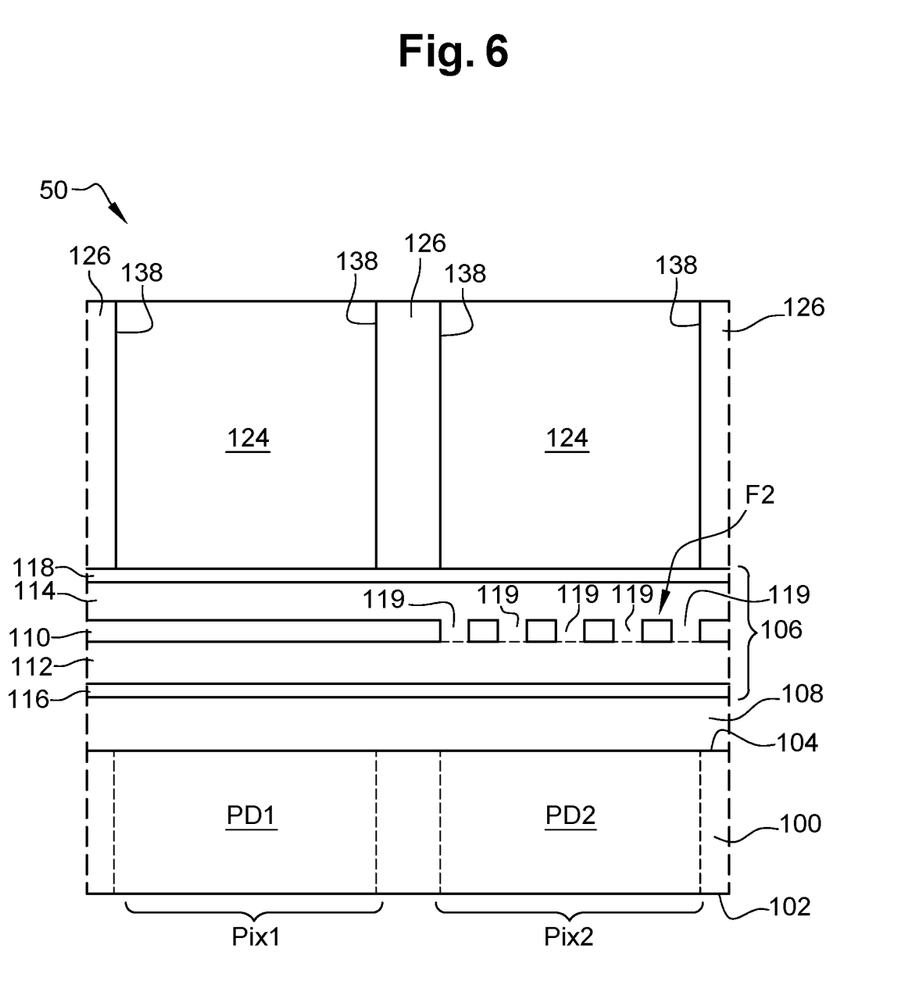
FIG. 6 is a simplified cross-section view of a portion of a light sensor according to still another alternative embodiment.

FIG. 6 is a simplified cross-section view illustrating another alternative embodiment of sensor 1. More particularly, FIG. 6 shows a portion only of a sensor 50 according to this other alternative embodiment, the shown portion of sensor 50 corresponding to the portion of sensor 1 shown in FIG. 1. Only the structural and possible functional differences between sensors 1 and 50 are detailed herein.

The sensor 50 of FIG. 6 differs from the sensor 1 of FIG. 1 only in the way in which the optional optical devices configured so that the light to be analyzed reaches structure 106 under a normal incidence are implemented. More particularly, in FIG. 6, in each concerned pixel, particularly in each of pixels Pix1 and Pix2, the optical device does not comprise lenses 120 and 122, and, further, lateral wall 126 has a sufficient height for the light to be analyzed crossing an opening 138 laterally delimited by wall 126, and arranged above and opposite the photoconversion area of the pixel, to reach structure 106 under a normal incidence. It will be within the abilities of those skilled in the art to determine the height of walls 126 to obtain such a normal incidence.

In the example shown in FIG. 6, layer 124 fills each opening 138. The presence of layer 124 provides a better mechanical resistance to sensor 50 although it may be omitted.

This alternative embodiment is compatible with the alternative embodiments described in relation with FIGS. 2, 3, 4, and 5.

The operation of sensors 10, 20, 30, 40, and 50 is similar to that of the sensor 1 of FIG. 1 and will not be described again.

Further, sensors 10, 20, 30, 40, and 50 benefit at least from the same advantages as the sensor 1 of FIG. 1.

Figure 7A:
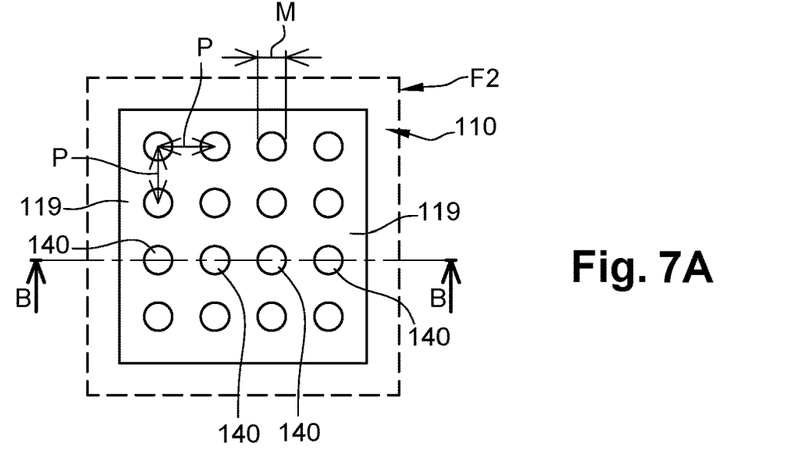
FIGS. 7A-7B illustrate in top and cross-section views an embodiment of a Fano resonance filter of a light sensor.
Figure 7B:
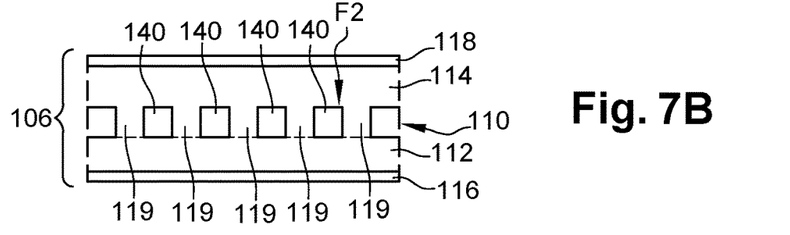

FIG. 7A illustrates a top view and FIG. 7B illustrates a cross-section view of an embodiment of a Fano resonance filter of sensors 1, 30, 40, and 50, for example, of filter F2. FIG. 7B is a cross-section view along plane BB of FIG. 7A, and layer 114 and optional antireflection coating 118 are not shown in FIG. 7A.

In this embodiment, the periodic structure of filter F2 corresponds to a periodic repetition of a pad 140 of the material of layer 110, each pad 140 being laterally delimited by corresponding openings 119 in layer 110. More exactly, pad 140 is repeated with a pitch P (FIG. 7A) in two directions orthogonal to each other and parallel to the plane of the upper surface of layer 110. In this example, pads 140 have a circular shape in top view or, in other words, correspond to cylinders of the material of layer 110. Pads 140 have, in a plane parallel to the plane of the upper surface of layer 110, a characteristic dimension M (FIG. 7A) corresponding, in the present example, to the diameter of pads 140. In other examples, not shown, pads 140 may have, in top view, other shapes than a circular shape, for example, the shape of a square having a side length M.

Although FIGS. 7A-7B show a filter F2 only comprising 16 pads 140, in practice, filter F2 may comprise a much larger number of pads 140, for example, several tens, hundreds, or even thousands of pads 140.

Figure 8A:
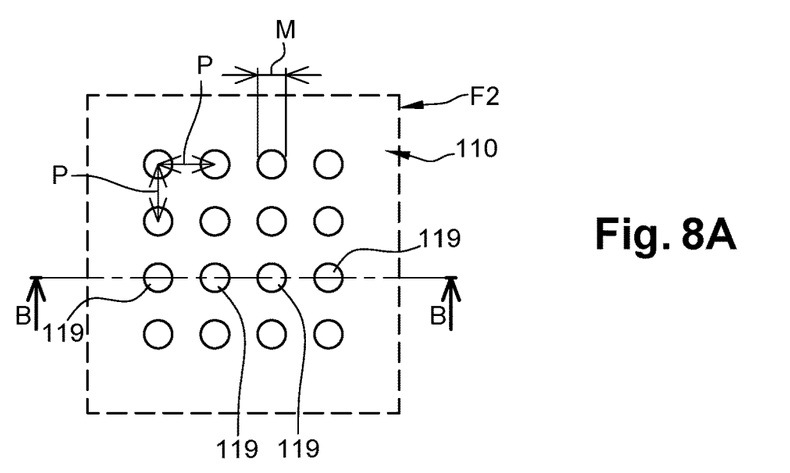
FIGS. 8A-8B illustrate in top and cross-section views an alternative embodiment of the filter of FIG. 7.
Figure 8B:
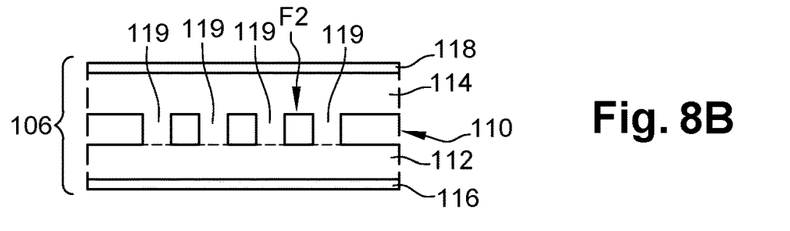

FIG. 8A illustrates a top view and FIG. 8B illustrates a cross-section view of an alternative embodiment of the filter F2 of FIGS. 7A-7B. FIG. 8B is a cross-section view along plane BB of FIG. 8A, and layer 114 and optional antireflection coating 118 are not shown in FIG. 8A.

In this alternative embodiment, the periodic structure of filter F2 corresponds to a periodic repetition of an opening 119 in layer 110. More exactly, opening 119 is repeated with a pitch P (FIG. 8A) in two directions orthogonal to each other and parallel to the plane of the upper surface of layer 110. In this example, openings 119 have a circular shape in top view or, in other words, correspond to cylindrical holes through layer 110. Openings 119 have, in a plane parallel to the plane of the upper surface of layer 110, a characteristic dimension M (FIG. 8A) corresponding, in the present example, to the diameter of openings 119. In other examples, not shown, openings 119 may have, in top view, other shapes than a circular shape, for example, the shape of a square having a side length M.

Although FIGS. 8A-8B show a filter F2 only comprising 16 openings 119, in practice, filter F2 may comprise a much larger number of openings 119, for example, several tens, hundreds, or even thousands of openings 119.

Figure 9A:
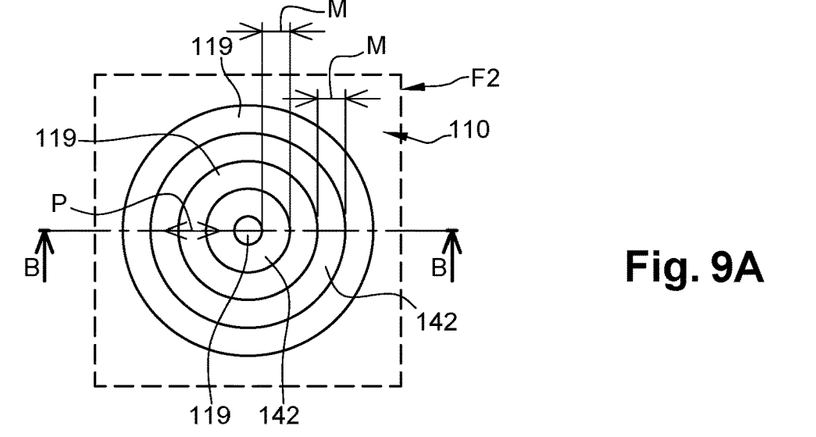
FIGS. 9A-9B illustrate in top and cross-section views another embodiment of a Fano resonance filter of a light sensor.
Figure 9B:
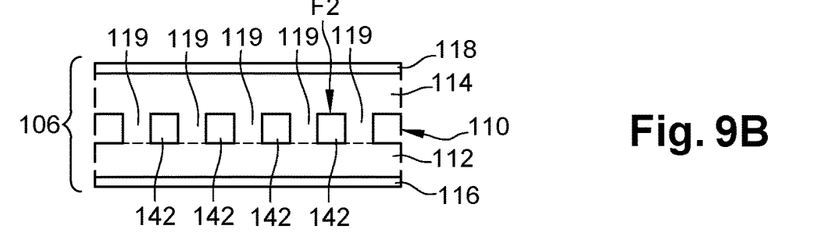

FIG. 9A illustrates a top view and FIG. 9B illustrates a cross-section view of another embodiment of the filter F2 of sensor 1. FIG. 9B is a cross-section view along plane BB of FIG. 9A, and layer 114 and optional antireflection coating 118 are not shown in FIG. 9A.

In this embodiment, the periodic structure of filter F2 corresponds to ring-shaped, preferably circular, and concentric strips 142 made of the material of layer 110. Strips 142 are distributed with respect to one another with a pitch P (FIG. 9A) and separated from one another by openings 119, themselves also ring-shaped and concentric. Strips 142 have, in a plane parallel to the plane of the upper surface of layer 110, a characteristic dimension M (FIG. 9A) here corresponding to their width.

Although FIGS. 9A-9B show a filter F2 only comprising 2 strips 142, in practice, filter F2 comprises a much larger number of strips 142, for example, at least ten strips 142, preferably several tens, hundreds, or even thousands of strips 142.

Figure 10A:
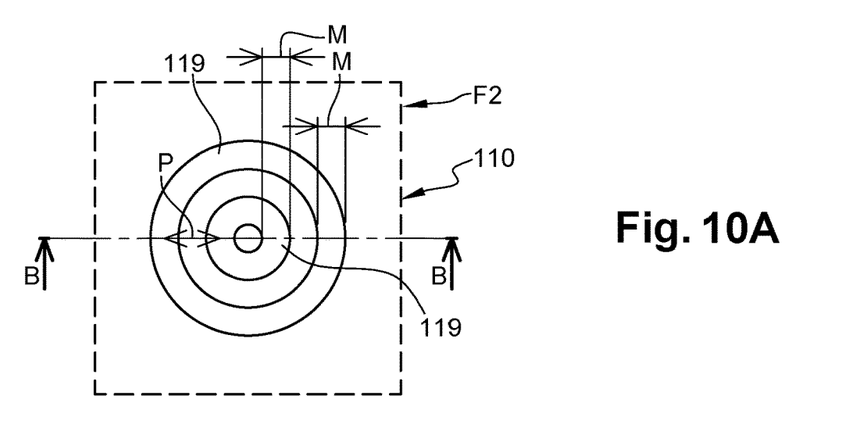
FIGS. 10A-10B illustrate in top and cross-section views an alternative embodiment of the filter of FIGS. 9A-9B.
Figure 10B:
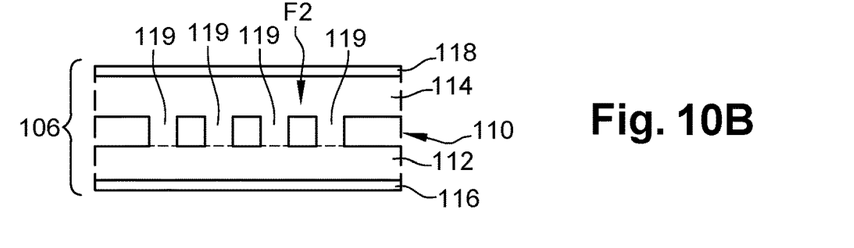

FIG. 10A illustrates a top view and FIG. 10B illustrates a cross-section view of an alternative embodiment of the filter F2 of FIGS. 9A-9B. FIG. 10B is a cross-section view along plane BB of FIG. 10A, and layer 114 and optional antireflection coating 118 are not shown in FIG. 10A.

In this alternative embodiment, the periodic structure of filter F2 corresponds to ring-shaped, preferably circular, and concentric openings 119. Openings 119 are distributed with respect to one another with a pitch P (FIG. 10A) and separated from one another by portions of layer 110, themselves also ring-shaped and concentric. Openings 119 have, in a plane parallel to the plane of the upper surface of layer 110, a characteristic dimension M (FIG. 10A) here corresponding to their width.

Although FIGS. 10A-10B show a filter F2 only comprising two openings 119, in practice, filter F2 comprises a much larger number of openings 119, for example, at least ten openings 119, preferably several tens, hundreds, or even thousands of openings 119.

The filters described in relation with FIGS. 7A-7B, 8A-8B, 9A-9B, and 10A-10B in the case where openings 119 crossing layer 110 may be adapted to the alternative embodiment where structure 106 comprises additional layers 130 and 132 (FIG. 3), or to the alternative embodiment where openings 119 are replaced with openings 119' (FIG. 2) which have, in top view, the same shape as the openings 119 that they replace but which do not cross layer 110.

In the various embodiments and variants of the Fano resonance filter described hereabove in relation with FIGS. 7A-7B, 8A-8B, 9A-9B, and 10A-10B, the central frequency of the filter is at least partly determined by pitch P of the periodic structure, and also by dimension M. It will be within the abilities of those skilled in the art to determine, for given dielectric materials, the pitch P and the dimension M enabling to obtain a Fano resonance filter having a desired central frequency. For this purpose, those skilled in the art may use computer-assisted simulation software such as the software designated with trade name Lumerical. Preferably, for a Fano resonance filter having a given central frequency, pitch P is smaller than the wavelength corresponding to this central frequency.

As an example, referring to the filter F2 of FIGS. 8A-8B, with silicon oxide layers 112 and 114, a silicon nitride layer 110, and a 100-nm thickness for layer 110, the inventors have obtained filters F2 having: a central frequency between 350 and 355 nm when P and M are respectively equal to 210 nm and 140 nm; a central frequency between 395 and 400 nm when P and M are respectively equal to 240 nm and 160 nm; a central frequency between 435 and 440 nm when P and M are respectively equal to 270 nm and 180 nm; a central frequency between 480 and 485 nm when P and M are respectively equal to 300 nm and 200 nm; a central frequency between 520 et 525 nm when P and M are respectively equal to 330 nm and 220 nm; a central frequency between 565 and 570 nm when P and M are respectively equal to 360 nm and 240 nm; a central frequency between 605 et 610 nm when P and M are respectively equal to 390 nm and 260 nm; and a central frequency between 650 and 655 nm when P and M are respectively equal to 420 nm and 280 nm.

FIGS. 11 to 15 are cross-section views illustrating successive steps of an implementation mode of a method of manufacturing a structure 106 such as described in relation with FIG. 1, and more particularly of the portion of structure 106 shown in FIG. 1 comprising filter F2.

Figure 11:
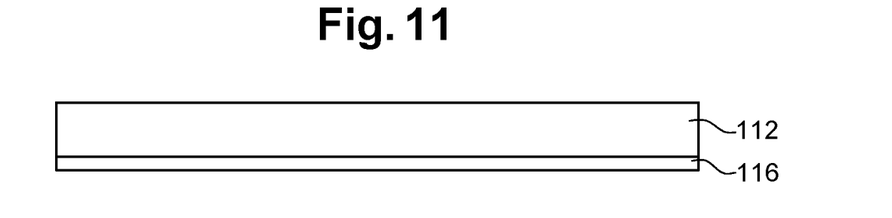
FIGS. 11-15 are cross-section view of a structure at successive steps of a manufacturing method according to an embodiment.

In FIG. 11, the structure comprises layer 112 and, in the illustrated implementation mode, the optional antireflection coating 116 covering the lower surface of layer 112.

According to an embodiment, layer 112 is formed, for example, deposited, on substrate 100 (not shown, see for example FIG. 1). For example, coating 116 is formed on substrate 100 or, when present, on layer 108, after which layer 112 is formed, for example, deposited, on coating 116. In the case where coating 116 is not provided, layer 112 is formed, for example, deposited, on substrate 100 or on layer 108 when the latter is present.

According to another embodiment, layer 112 is formed, for example, deposited, on a temporary support (not illustrated), for example, a silicon substrate. For example, coating 116 is formed on the temporary support, after which layer 112 is formed, for example, deposited, on coating 116. In the case where coating 116 is not provided, layer 112 is formed, for example, deposited, on the temporary support.

Figure 12:
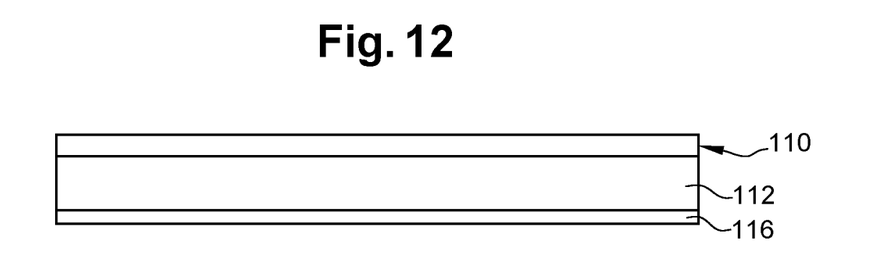

In FIG. 12, layer 110 is formed, for example, deposited, on layer 112 to cover layer 112. More particularly, layer 110 is formed on the entire exposed surface of layer 112, that is, for example, the surface of layer 112 opposite to the surface of layer 112 in contact with, according to cases, coating 116, layer 108, substrate 100, or the temporary support.

In the embodiment illustrated in FIG. 12, layer 110 is directly formed on layer 112 and thus rests on top of and in contact with layer 112.

Figure 13:
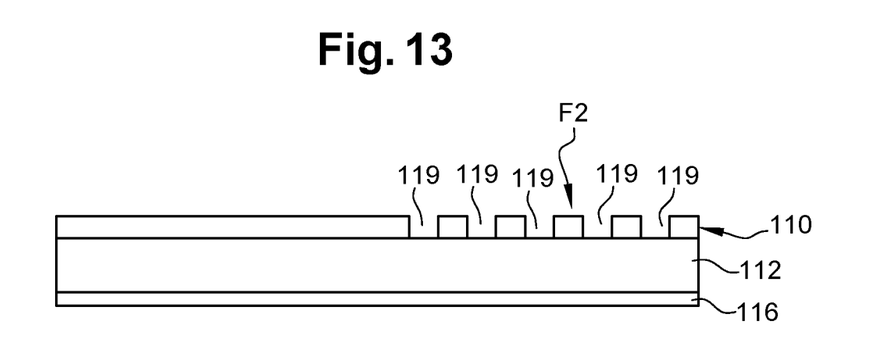

In FIG. 13, the periodic structure of filter F2 is defined in layer 110, by etching openings 119 in layer 110 at the location of filter F2.

At this step, simultaneously to the etching of openings 119, one or a plurality of openings 134 (FIG. 4) may be etched through the entire thickness of layer 110, at the level of each portion of structure 106 intended to be above the photoconversion area of a pixel comprising no Fano resonance filter, as is, for example, the case for pixel Pix1 in FIG. 4 where an opening 134 is etched above area PD1. Openings 134 have lateral dimensions such that no Fano resonance occurs therein, for example, lateral dimensions greater than the operating wavelengths of the sensor.

Figure 14:
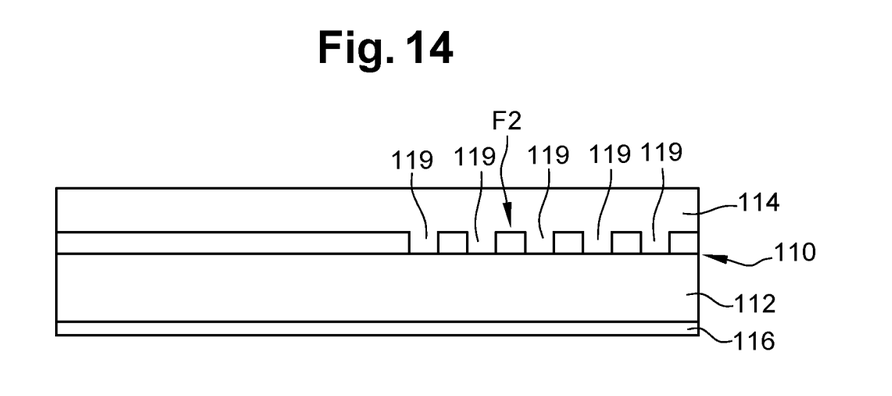

In FIG. 14, layer 114 is formed, for example, deposited, on layer 110, to entirely cover layer 110 and fill openings 119. The exposed surface of layer 114, here the upper surface of layer 114, is then planarized by chemical-mechanical polishing or CMP. During the CMP step, a portion of the thickness of layer 114 may be removed so that layer 114 has a desired thickness.

In an alternative embodiment, not shown, at the step of FIG. 12, the deposition of layer 110 is replaced with the deposition of a first layer made of the material of layer 112 and then, at the step of FIG. 13, pads complementary to openings 119 are defined by etching in the first layer. At the step of FIG. 14, layer 110 is deposited to fill the openings in the first layer, and then is removed down to the level of the upper surface of the first layer, after which layer 114 is deposited. In this case, the pads defined in the first layer form the openings in layer 110.

Figure 15:
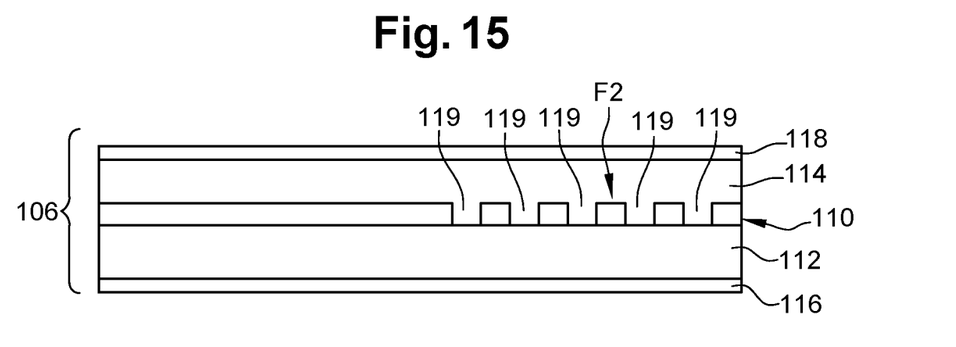

In FIG. 15, optional antireflection coating 118 is formed, for example, deposited, on the entire planarized surface of layer 114.

In the illustrated embodiment, coating 118 is directly formed on layer 114 and the structure 106 such as described in relation with FIG. 1 is obtained.

In alternative implementation modes, not shown, a filtering structure 136 (FIG. 5) may be directly formed on layer 114, prior to the optional forming of coating 118. In this case, optional coating 118, when it is provided, is then formed at a subsequent step on filtering structure 136 and does not form part of filtering structure 106.

The optical device configured so that, in each pixel, the light reaches structure 106 under a normal incidence, may be formed during subsequent steps within the abilities of those skilled in the art, for example, by forming lenses 120, by depositing layer 124, by planarizing layer 124, by etching trenches at the location of walls 126, by depositing a layer of the material of walls 126 to fill the trenches and form walls therein, and by forming lenses 124.

In the embodiment where layer 112 is formed on a temporary support, a step of removal of the temporary support, followed by a step of transfer, onto a substrate 100, of structure 106 possibly topped with filtering structure 136 and/or with the optical devices enabling to obtain light reaching structure 106 under a normal incidence, may be provided. As a variation, structure 106 deprived of its temporary support may be arranged above substrate 100, for example by being maintained in an opening of a package having substrate 100 encapsulated therein.

Figure 16:
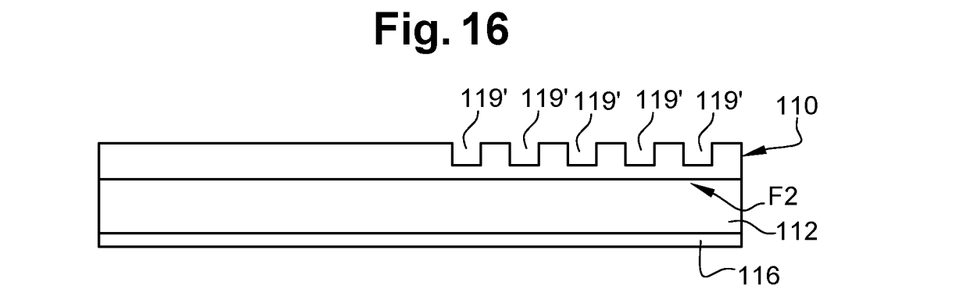
FIG. 16 is a cross-section view of the structure of FIG. 12 at a next step of the method according to an alternative embodiment.

FIG. 16 is a cross-section view of the structure of FIG. 12 at a next step of the method, according to an alternative embodiment where filter F2 comprises openings 119' (FIG. 2) instead of openings 119.

Thus, in FIG. 16, instead of etching openings 119 across the entire thickness of layer 110, openings or cavities 119' are etched in layer 110, across a portion only of the thickness of layer 110. The etching is then a time etching, which is stopped at the end of a predefined time period enabling to obtain openings 119' having the desired depth.

Similarly to what has been described in relation with FIG. 13, it may be provided to etch, simultaneously to openings 119', an opening similar to the opening 134 described in relation with FIG. 4, having the same depth as openings 119' and which thus do not cross layer 110 across its entire thickness.

The method then carries on with the implementation of the steps described in relation with FIGS. 14 and 15, the possible step of forming an additional filtering structure 136, the possible step of forming the optical devices allowing a normal incidence of light on structure 106, and the possible transfer step.

Figure 17:
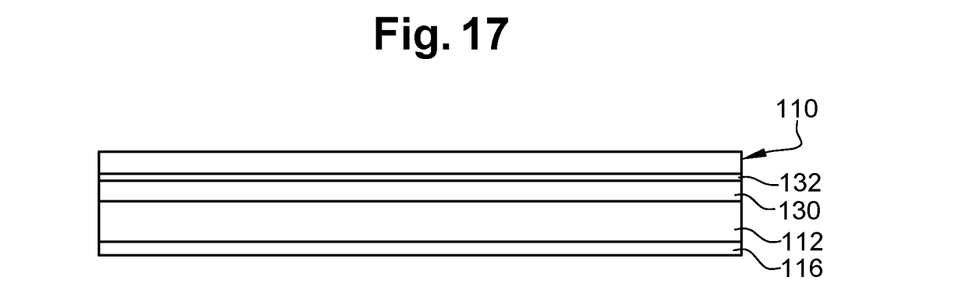
FIG. 17 is a cross-section view of the structure of FIG. 11 at a next step of the method according to an alternative embodiment.

FIG. 17 is a cross-section view of the structure of FIG. 11 at a next step of the method, according to an alternative embodiment where structure 106 comprises additional layers 130 and 132 (FIG. 3).

Thus, in FIG. 17, prior to the forming of layer 110, layers 130 and 132 have been formed, for example, deposited, on layer 112. Layer 110 has then been formed, for example deposited, on layer 132. More particularly, layer 130 is formed to entirely cover the entire surface of layer 112, layer 130 then resting on top of and in contact with layer 112. Layer 132 is then formed to entirely cover the upper surface of layer 130, layer 132 then resting on top of and in contact with layer 130. Then, layer 110 is formed to entirely cover the upper surface of layer 132, layer 110 then resting on top of and in contact with layer 132. In other words, layer 110 directly rests on layer 132, and indirectly on layer 112.

Figure 18:
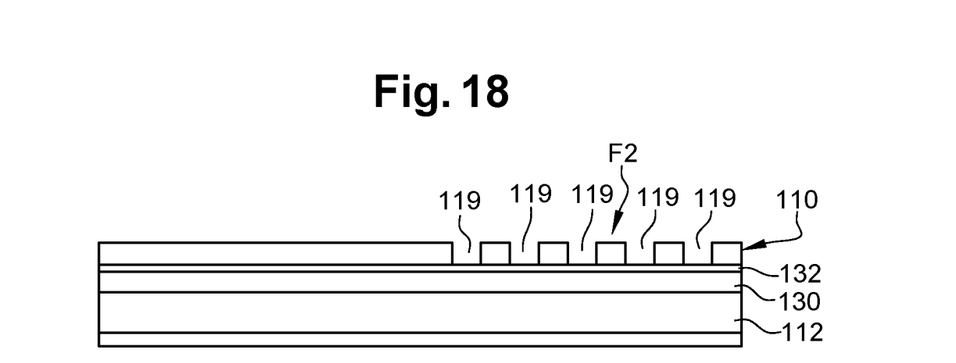
FIG. 18 is a cross-section view of the structure of FIG. 17 at a next step of the method.

FIG. 18 is a cross-section view of the structure of FIG. 17 at a next step of the method.

In FIG. 18, the periodic structure of filter F2 is defined in layer 110, by etching openings 119 in layer 110 at the location of filter F2. During the etching of openings 119, which cross layer 110 across its entire thickness, layer 132 is used as an etch stop layer. Once openings 119 have been etched, the portions of layer 132 exposed at the bottom of openings 119 may be left in place, or then removed during a next etch step. The implementation of the masks enabling to etch openings 119 and possibly to etch the exposed portions of layer 132 is within the abilities of those skilled in the art.

Similarly to what has been described in relation with FIG. 13, simultaneously to the etching of openings 119 and of the possible exposed portions of layer 132, an opening 134 may be etched through layer 110, and possible through layer 132, at the level of each portion of structure 106 intended to be above the photoconversion area of a pixel comprising no Fano resonance filter, as is for example the case of pixel Pix1 in FIG. 4.

The method then carries on with the implementation of the steps described in relation with FIGS. 14 and 15, the possible step of forming an additional filtering structure 136, the possible step of forming the optical devices allowing a normal incidence of light on structure 106, and the possible transfer step.

Embodiments and alternative embodiments of a filtering structure 106 have been described hereabove while only describing part of this structure 106 having a portion comprising a Fano resonance filter F2 intended for pixel Pix2, and having another portion comprising no Fano resonance filter and intended for pixel Pix1. In practice, structure 106 may comprise any non-zero number of portions, each of which is intended for a corresponding pixel and comprising a Fano resonance filter of the pixel, and any non-zero number of portions, each of which is intended for a corresponding pixel and comprising no Fano resonance filter. Such portions, comprising or not a Fano resonance filter, are simultaneously manufactured by the implementation of the methods described in relation with FIGS. 11 to 18.

Further, when a structure 106 comprises a plurality of Fano resonance filters, all these filters preferably have a same periodic structure, possibly with different dimensions M and pitches P, and thus different central frequencies. However, it is also possible, with no additional steps, to provide for filters of structure 106 to have different periodic structures, for example, for one filter to have the structure described in relation with FIG. 8 and for another filter to have the structure described in relation with FIG. 10.

Various embodiments and variants have been described. Those skilled in the art will understand that certain features of these various embodiments, implementation modes, and variants, may be combined and other variants will occur to those skilled in the art.

Finally, the practical implementation of the described embodiments, implementation modes and variants is within the abilities of those skilled in the art based on the functional indications given hereabove. In particular, it will be within the abilities of those skilled in the art to determine the number of different Fano resonance filters as well as the pitch P and the dimension M of each of these filters according to the number of wavelength ranges of analysis of the light received by the sensor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A light sensor, comprising:
   a plurality of pixels;
   wherein each pixel comprises a photoconversion area;
   wherein said plurality of pixels includes a first pixel and a second pixel;
   a first band-stop Fano resonance filter provided over said first pixel; and
   wherein the second pixel comprises no Fano resonance filter.

2. The sensor according to claim 1, wherein said first band-stop Fano resonance filter comprises a periodic structure defined in a first layer of a first dielectric material.

3. The sensor according to claim 2, wherein said first band-stop Fano resonance filter comprises a first layer of a second dielectric material and a second layer of the second dielectric material, the first layer of the first dielectric material resting on the first layer of the second dielectric material and being covered with the second layer of the second dielectric material.

4. The sensor according to claim 3, wherein the first dielectric material is selected from the group consisting of: amorphous carbon, amorphous silicon, silicon nitride, non-doped polysilicon, and silicon carbide, the second dielectric material comprises silicon oxide.

5. The sensor according to claim 3, wherein the first layer of the first dielectric material is in contact with the first layer of the second dielectric material.

6. The sensor according to claim 3, wherein the second layer of the first dielectric material is resting on top of and in contact with the first layer of the second dielectric material, and further comprising a third layer of a dielectric material resting on top of and in contact with the second layer of the first dielectric material, and wherein the first layer of the first dielectric material is resting on top of and in contact with said third layer.

7. The sensor according to claim 6, wherein the dielectric material of the third layer comprises the second dielectric material.

8. The sensor according to claim 3, wherein the first layer of the second dielectric material rests on a first antireflection coating.

9. The sensor according to claim 3, wherein a second antireflection coating rests on the second layer of the second dielectric material.

10. The sensor according to claim 2, wherein the periodic structure has a pitch smaller than a wavelength filtered by said first band-stop Fano resonance filter.

11. The sensor according to claim 2, wherein said plurality of pixels further comprises a third pixel, and further comprising a second band-stop Fano resonance filter provided over said third pixel, wherein the second band-stop Fano resonance filter has a central frequency of a rejection band different from a central frequency of a rejection band of the first band-stop Fano resonance filter.

12. The sensor according to claim 11, wherein the second band-stop Fano resonance filter comprises all the layers of the first band-stop Fano resonance filter and a periodic structure defined in the first layer of the first dielectric material.

13. The sensor according to claim 2, wherein the periodic structure defined in the first layer of the first dielectric material comprises an array of pads.

14. The sensor according to claim 2, wherein the periodic structure defined in the first layer of the first dielectric material comprises an arrangement of concentric rings.

15. The sensor according to claim 1, further comprising a processing circuit configured to:
   receive an output signal from each of the first and second pixels that is representative of the quantity of light received by the photoconversion area of the pixel during a pixel illumination phase; and
   determine from the output signals of the first and second pixels information representative of the quantity of light received by the sensor during the illumination phase in a rejection band of the first band-stop Fano resonance filter.

16. The sensor according to claim 15, wherein the processing circuit makes the determination by subtracting the output signal of the first pixel from the output signal of the second pixel.

17. The sensor according to claim 15, wherein the processing circuit further operates to apply a correction factor to each of the output signals of the first and second pixels, wherein said correction factor accounts for differences in light transmission through a filtering structure which includes said first band-stop Fano resonance filter.

18. The sensor according to claim 16, wherein the processing circuit further operates to apply a normalization to each of the output signals of the first and second pixels.

19. A manufacturing method, comprising the steps of:
a) forming a first layer of a first dielectric material resting on a first layer of a second dielectric material;
b) forming at least one band-stop Fano resonance filter by etching, across at least part of the thickness of the first layer of the first dielectric material, portions of the first layer of the first dielectric material to define therein a periodic structure of said at least one band-stop Fano resonance filter;
c) forming a second layer of the second dielectric material to cover the first layer of the first dielectric material; and
d) planarizing an exposed surface of the second layer of the second dielectric material by a chemical-mechanical polishing.

20. The method according to claim 19, further comprising, before step a), forming a first antireflection coating wherein the first layer of the second dielectric material rests on the first antireflection coating.

21. The method according to claim 19, further comprising, at step d), forming a second antireflection coating resting on the second layer of the second dielectric material.

22. The method according to claim 19, wherein:
step a) further comprises forming of a second layer of the first dielectric material resting on the first layer of the second dielectric material, and then forming a dielectric etch stop layer resting on top of and in contact with the second layer of the first dielectric material; at step a), forming the first layer of the first dielectric material on top of and in contact with the etch stop layer; and
at step b), stopping etching the first layer of the first dielectric material on the etch stop layer.

23. The method according to claim 19, wherein:
at step a), the first layer of the first dielectric material rests on a semiconductor substrate having photoconversion areas of pixels of a light sensor defined therein, said at least one band-stop Fano resonance filter defined in the first layer of the first dielectric material positioned over one pixel of the light sensor, and wherein another pixel of said light sensor comprises no Fano resonance filter defined in the first layer of the first dielectric material.

24. The method according to claim 19, wherein:
after step d), a stack comprising the layers formed at the previous steps is transferred above a semiconductor substrate having photosensitive areas of pixels of a light sensor defined therein, so that said at least one band-stop Fano resonance filter defined in the first layer of the first dielectric material is positioned over one pixel of the light sensor, and another pixel of the light sensor comprises no Fano resonance filter defined in the first layer.

* * * * *

UNITED STATES PATENT AND TRADEMARK OFFICE
CERTIFICATE OF CORRECTION

| | |
|---|---|
| PATENT NO. | : 11,391,624 B2 |
| APPLICATION NO. | : 17/116851 |
| DATED | : July 19, 2022 |
| INVENTOR(S) | : Olivier Le Neel et al. |

It is certified that error appears in the above-identified patent and that said Letters Patent is hereby corrected as shown below:

On the Title Page

Item (30) The foreign priority information is missing and should be added:
-- (30) Foreign Application Priority Data
Dec. 10, 2019   (FR) ................ 1914079 --

Signed and Sealed this
Fourteenth Day of February, 2023

*Katherine Kelly Vidal*
Katherine Kelly Vidal
*Director of the United States Patent and Trademark Office*